(12) United States Patent
Lai et al.

(10) Patent No.: US 11,761,079 B2
(45) Date of Patent: Sep. 19, 2023

(54) OXIDATION RESISTANT PROTECTIVE LAYER IN CHAMBER CONDITIONING

(71) Applicant: Lam Research Corporation, Fremont, CA (US)

(72) Inventors: Fengyuan Lai, Tualatin, OR (US); Bo Gong, Sherwood, OR (US); Guangbi Yuan, Beaverton, OR (US); Chen-Hua Hsu, Taiwan (TW); Bhadri Varadarajan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/770,526

(22) PCT Filed: Dec. 6, 2018

(86) PCT No.: PCT/US2018/064304
§ 371 (c)(1),
(2) Date: Jun. 5, 2020

(87) PCT Pub. No.: WO2019/113351
PCT Pub. Date: Jun. 13, 2019

(65) Prior Publication Data
US 2021/0164097 A1 Jun. 3, 2021

Related U.S. Application Data

(60) Provisional application No. 62/595,948, filed on Dec. 7, 2017.

(51) Int. Cl.
*C23C 16/40* (2006.01)
*C23C 16/44* (2006.01)
(Continued)

(52) U.S. Cl.
CPC ........ *C23C 16/401* (2013.01); *C23C 16/4404* (2013.01); *C23C 16/45536* (2013.01);
(Continued)

(58) Field of Classification Search
None
See application file for complete search history.

(56) References Cited

U.S. PATENT DOCUMENTS

| 4,410,395 A | 10/1983 | Weaver et al. |
| 4,892,753 A | 1/1990 | Wang et al. |

(Continued)

FOREIGN PATENT DOCUMENTS

| CN | 1798867 A | 7/2006 |
| CN | 101053063 A | 10/2007 |

(Continued)

OTHER PUBLICATIONS

"International Application Serial No. PCT US2018 064304, International Preliminary Report on Patentability dated Jun. 18, 2020", 5 pages.

(Continued)

*Primary Examiner* — Jose I Hernandez-Kenney
(74) *Attorney, Agent, or Firm* — Weaver Austin Villeneuve and Sampson LLP (57) ABSTRACT

In some examples, a method for conditioning a wafer processing chamber comprises setting a pressure in the chamber to a predetermined pressure range, setting a temperature of the chamber to a predetermined temperature, and supplying a process gas mixture to a gas distribution device within the chamber. A plasma is struck within the chamber and a condition in the chamber is monitored. Based on a detection of the monitored condition meeting or transgressing a threshold value, a chamber conditioning operation is implemented. The chamber conditioning operation may (Continued)

include depositing a preconditioning film onto an internal surface of the chamber, depositing a silicon oxycarbide (SiCO) film onto the preconditioning film, and depositing a protective layer onto the SiCO film.

14 Claims, 5 Drawing Sheets

(51) Int. Cl.
    *C23C 16/455* (2006.01)
    *C23C 16/505* (2006.01)
    *H01L 21/02* (2006.01)
    *H01J 37/32* (2006.01)

(52) U.S. Cl.
    CPC ........ *C23C 16/505* (2013.01); *H01L 21/0262* (2013.01); *H01J 37/32522* (2013.01); *H01J 37/32816* (2013.01)

(56) References Cited

U.S. PATENT DOCUMENTS

| | | | |
|---|---|---|---|
| 5,154,810 A * | 10/1992 | Kamerling | C23C 14/08 118/712 |
| 5,443,686 A | 8/1995 | Jones et al. | |
| 5,605,859 A | 2/1997 | Lee | |
| 5,647,953 A | 7/1997 | Williams et al. | |
| 5,654,475 A | 8/1997 | Vassiliou et al. | |
| 5,811,356 A | 9/1998 | Murugesh et al. | |
| 5,824,375 A | 10/1998 | Gupta | |
| 5,902,135 A | 5/1999 | Schulze | |
| 5,970,383 A | 10/1999 | Lee | |
| 6,071,573 A | 6/2000 | Koemtzopoulos et al. | |
| 6,121,161 A | 9/2000 | Rossman et al. | |
| 6,121,164 A | 9/2000 | Yieh et al. | |
| 6,162,323 A | 12/2000 | Koshimizu | |
| 6,223,685 B1 | 5/2001 | Gupta et al. | |
| 6,416,577 B1 | 7/2002 | Suntoloa et al. | |
| 6,449,521 B1 | 9/2002 | Gupta | |
| 6,534,380 B1 | 3/2003 | Yamauchi et al. | |
| 6,626,188 B2 | 9/2003 | Fitzsimmons et al. | |
| 6,696,362 B2 | 2/2004 | Rossman et al. | |
| 6,749,098 B2 | 6/2004 | Roier et al. | |
| 6,776,873 B1 | 8/2004 | Sun et al. | |
| 6,815,007 B1 | 11/2004 | Yoo et al. | |
| 6,818,570 B2 * | 11/2004 | Tsuji | H01L 21/02216 438/680 |
| 6,819,969 B2 | 11/2004 | Lee et al. | |
| 6,933,254 B2 | 8/2005 | Morita et al. | |
| 7,118,779 B2 | 10/2006 | Verghese et al. | |
| 7,138,332 B2 * | 11/2006 | Goundar | H01L 21/76801 438/624 |
| 7,183,177 B2 | 2/2007 | Al-Bayati et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 | 10/2007 | Li et al. | |
| 7,601,639 B2 | 10/2009 | Pavone et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,088,296 B2 | 1/2012 | Yamazaki | |
| 8,101,531 B1 | 1/2012 | Li et al. | |
| 8,163,087 B2 | 4/2012 | Faguet et al. | |
| 8,293,658 B2 | 10/2012 | Shero et al. | |
| 9,228,259 B2 | 1/2016 | Haukka et al. | |
| 9,328,416 B2 | 5/2016 | Dhas et al. | |
| 9,745,658 B2 | 8/2017 | Kang et al. | |
| 9,828,672 B2 | 11/2017 | Varadarajan et al. | |
| 9,850,573 B1 | 12/2017 | Sun | |
| 9,869,020 B2 | 1/2018 | Malinen et al. | |
| 10,023,956 B2 | 7/2018 | Cui et al. | |
| 10,134,569 B1 * | 11/2018 | Albarede | G02B 6/02 |
| 10,211,099 B2 | 2/2019 | Wang et al. | |
| 10,704,141 B2 | 7/2020 | Malik et al. | |
| 10,745,805 B2 | 8/2020 | Firouzdor et al. | |
| 10,760,158 B2 | 9/2020 | Shanbhag et al. | |
| 11,365,479 B2 | 6/2022 | Shanbhag et al. | |
| 2001/0006835 A1 | 7/2001 | Kim et al. | |
| 2002/0073922 A1 | 6/2002 | Frankel et al. | |
| 2002/0076490 A1 | 6/2002 | Chiang et al. | |
| 2002/0192359 A1 * | 12/2002 | Johnson | H01J 37/32862 427/10 |
| 2003/0013314 A1 | 1/2003 | Ying et al. | |
| 2003/0031793 A1 | 2/2003 | Chang et al. | |
| 2003/0127049 A1 | 7/2003 | Han et al. | |
| 2003/0203123 A1 | 10/2003 | Shang et al. | |
| 2004/0023516 A1 | 2/2004 | Londergan et al. | |
| 2004/0045503 A1 | 3/2004 | Lee et al. | |
| 2004/0134427 A1 | 7/2004 | Derderian et al. | |
| 2004/0149386 A1 | 8/2004 | Numasawa et al. | |
| 2004/0182833 A1 | 9/2004 | Fink | |
| 2005/0130427 A1 | 6/2005 | Won et al. | |
| 2005/0214455 A1 | 9/2005 | Li et al. | |
| 2005/0221020 A1 | 10/2005 | Fukiage | |
| 2006/0046470 A1 | 3/2006 | Becknell et al. | |
| 2006/0093756 A1 | 5/2006 | Rajagopalan et al. | |
| 2006/0189171 A1 | 8/2006 | Chua et al. | |
| 2006/0269691 A1 * | 11/2006 | Saki | C23C 16/40 118/723 R |
| 2006/0280868 A1 | 12/2006 | Kato et al. | |
| 2007/0201016 A1 | 8/2007 | Song et al. | |
| 2008/0066677 A1 | 3/2008 | Morozumi et al. | |
| 2008/0094775 A1 | 4/2008 | Sneh et al. | |
| 2008/0118663 A1 | 5/2008 | Choi et al. | |
| 2008/0286982 A1 | 11/2008 | Li et al. | |
| 2008/0302281 A1 | 12/2008 | Bernard et al. | |
| 2009/0041952 A1 | 2/2009 | Yoon et al. | |
| 2009/0197401 A1 | 8/2009 | Li et al. | |
| 2009/0200269 A1 | 8/2009 | Kadkhodayan et al. | |
| 2009/0242511 A1 | 10/2009 | Shimazu et al. | |
| 2009/0253269 A1 | 10/2009 | Tsuneda | |
| 2009/0278116 A1 | 11/2009 | Yamate | |
| 2009/0308840 A1 | 12/2009 | Kohno et al. | |
| 2009/0325391 A1 | 12/2009 | De Vusser et al. | |
| 2010/0048028 A1 | 2/2010 | Rasheed et al. | |
| 2010/0104760 A1 | 4/2010 | Matsui et al. | |
| 2010/0186512 A1 | 7/2010 | Goto et al. | |
| 2010/0243192 A1 | 9/2010 | Balasubramanian et al. | |
| 2011/0045676 A1 * | 2/2011 | Park | C23C 16/401 438/771 |
| 2011/0056626 A1 | 3/2011 | Brown et al. | |
| 2011/0070380 A1 | 3/2011 | Shero et al. | |
| 2011/0151142 A1 | 6/2011 | Seamons et al. | |
| 2011/0230008 A1 | 9/2011 | Lakshmanan et al. | |
| 2011/0256726 A1 | 10/2011 | LaVoie et al. | |
| 2011/0315186 A1 | 12/2011 | Gee et al. | |
| 2012/0097330 A1 | 4/2012 | Iyengar et al. | |
| 2012/0122319 A1 | 5/2012 | Shimizu | |
| 2013/0012030 A1 | 1/2013 | Lakshmanan et al. | |
| 2013/0017685 A1 | 1/2013 | Akae et al. | |
| 2013/0064973 A1 | 3/2013 | Chen et al. | |
| 2013/0089988 A1 | 4/2013 | Wang et al. | |
| 2013/0302980 A1 | 11/2013 | Chandrashekar et al. | |
| 2013/0330935 A1 * | 12/2013 | Varadarajan | H01L 21/02211 257/E21.24 |
| 2014/0106573 A1 | 4/2014 | Terasaki et al. | |
| 2014/0120738 A1 | 5/2014 | Jung et al. | |
| 2014/0127852 A1 | 5/2014 | De Souza et al. | |
| 2014/0158674 A1 | 6/2014 | Moffatt et al. | |
| 2014/0184705 A1 | 7/2014 | Wakamatsu et al. | |
| 2014/0209026 A1 | 7/2014 | LaVoie et al. | |
| 2014/0272184 A1 | 9/2014 | Sreekala et al. | |
| 2014/0295670 A1 | 10/2014 | Shih et al. | |
| 2014/0319544 A1 | 10/2014 | Hwang | |
| 2015/0017335 A1 | 1/2015 | Werner | |
| 2015/0147482 A1 * | 5/2015 | Kang | C23C 16/4404 427/535 |
| 2015/0203967 A1 | 7/2015 | Dhas et al. | |
| 2015/0218700 A1 | 8/2015 | Nguyen et al. | |

(56) References Cited

U.S. PATENT DOCUMENTS

| | | | |
|---|---|---|---|
| 2015/0221553 A1 | 8/2015 | Ouye | |
| 2015/0307982 A1 | 10/2015 | Firouzdor et al. | |
| 2015/0345017 A1 | 12/2015 | Chang et al. | |
| 2015/0361547 A1 | 12/2015 | Lin et al. | |
| 2016/0016286 A1 | 1/2016 | Suh et al. | |
| 2016/0281230 A1* | 9/2016 | Varadarajan | C23C 16/4404 |
| 2016/0300713 A1 | 10/2016 | Cui et al. | |
| 2016/0329206 A1* | 11/2016 | Kumar | H01L 21/022 |
| 2016/0375515 A1 | 12/2016 | Xu et al. | |
| 2017/0152968 A1 | 6/2017 | Raj et al. | |
| 2017/0204516 A1 | 7/2017 | Nguyen et al. | |
| 2017/0301522 A1 | 10/2017 | Sun et al. | |
| 2017/0314125 A1 | 11/2017 | Fenwick et al. | |
| 2017/0314128 A1 | 11/2017 | Kang et al. | |
| 2017/0323772 A1 | 11/2017 | Fenwick et al. | |
| 2018/0016678 A1 | 1/2018 | Fenwick et al. | |
| 2018/0044791 A1 | 2/2018 | Varadarajan et al. | |
| 2018/0057939 A1 | 3/2018 | Yun et al. | |
| 2018/0127864 A1 | 5/2018 | Latchford et al. | |
| 2018/0174901 A1 | 6/2018 | Wang et al. | |
| 2018/0202047 A1 | 7/2018 | Lin et al. | |
| 2018/0265972 A1 | 9/2018 | Firouzdor et al. | |
| 2018/0265973 A1 | 9/2018 | Firouzdor et al. | |
| 2018/0337026 A1 | 11/2018 | Firouzdor et al. | |
| 2018/0347037 A1 | 12/2018 | Zhai et al. | |
| 2019/0078206 A1 | 3/2019 | Wu et al. | |
| 2019/0185999 A1 | 6/2019 | Shanbhag et al. | |
| 2019/0271076 A1 | 9/2019 | Fenwick et al. | |
| 2020/0347497 A1 | 11/2020 | Shanbhag et al. | |
| 2021/0340670 A1 | 11/2021 | Singhal et al. | |
| 2022/0145459 A1 | 5/2022 | Varadarajan et al. | |
| 2022/0275504 A1 | 9/2022 | Shanbhag et al. | |
| 2023/0002891 A1 | 1/2023 | Shanbhag et al. | |

FOREIGN PATENT DOCUMENTS

| | | |
|---|---|---|
| CN | 101313085 A | 11/2008 |
| CN | 102892922 A | 1/2013 |
| CN | 103098174 A | 5/2013 |
| CN | 103243310 A | 8/2013 |
| CN | 104272440 A | 1/2015 |
| CN | 104651807 A | 5/2015 |
| CN | 106270863 A | 1/2017 |
| CN | 111448640 | 7/2020 |
| JP | 2003224076 A | 8/2003 |
| JP | 2005085878 A | 3/2005 |
| JP | 2009094340 A | 4/2009 |
| JP | 2009147373 A | 7/2009 |
| JP | 2009188198 A | 8/2009 |
| JP | 2009263764 A | 11/2009 |
| JP | 2010103443 A | 5/2010 |
| JP | 2011020995 A | 2/2011 |
| JP | 2011187934 A | 9/2011 |
| JP | 2012216696 A | 11/2012 |
| JP | 2014532304 A | 12/2014 |
| JP | 2015122486 A | 7/2015 |
| JP | 2016051864 A | 4/2016 |
| JP | 2016216817 A | 12/2016 |
| JP | 2017512375 A | 5/2017 |
| JP | 2017514991 A | 6/2017 |
| JP | 2017199907 A | 11/2017 |
| JP | 2021506126 | 2/2021 |
| KR | 19980018744 A | 6/1998 |
| KR | 100382370 B1 | 5/2003 |
| KR | 20040022056 A | 3/2004 |
| KR | 20060055138 A | 5/2006 |
| KR | 20070085564 A | 8/2007 |
| KR | 20080105539 A | 12/2008 |
| KR | 20090016403 A | 2/2009 |
| KR | 20090053823 A | 5/2009 |
| KR | 20130055582 A | 5/2013 |
| KR | 20140141686 A | 12/2014 |
| KR | 20160115761 A | 10/2016 |
| KR | 20170122674 A | 11/2017 |
| TW | 200535277 A | 11/2005 |
| TW | 200830942 A | 7/2008 |
| TW | 200917363 A | 4/2009 |
| TW | 201405707 A | 2/2014 |
| TW | 201405781 A | 2/2014 |
| TW | 201425633 A | 7/2014 |
| TW | 201626503 A | 7/2016 |
| TW | I609455 B | 12/2017 |
| WO | WO-2006054854 A1 | 5/2006 |
| WO | WO-2007027350 A2 | 3/2007 |
| WO | WO-2009085117 A2 | 7/2009 |
| WO | WO-2011111498 A1 | 9/2011 |
| WO | WO-2013043330 A1 | 3/2013 |
| WO | WO-2014137532 A1 | 9/2014 |
| WO | WO-2016131024 A1 | 8/2016 |
| WO | WO-2021029970 A1 | 2/2021 |
| WO | WO-2021050168 A1 | 3/2021 |

OTHER PUBLICATIONS

International Application Serial No. PCT/US2018/064304, International Search Report dated Apr. 1, 2019, 3 pgs.

International Application Serial No. PCT/US2018/064304, Written Opinion dated Apr. 1, 2019, 3 pgs.

Advanced Energy Industries, Inc. brochure. "Remote Plasma Source Chamber Anodization". 2018, pp. 1-8.

Chinese First Office Action dated Jun. 3, 2019 issued in Application No. CN 201711372325.2.

Chinese First Office Action, dated Mar. 20, 2018 issued in Application No. CN 201610181756.X.

Chinese First Office Action, dated Sep. 5, 2016, issued in Application No. CN 201410686823.4.

Chinese Notice of Allowance, dated Mar. 3, 2020 issued in Application No. CN 201610181756.X.

Chinese Second Office Action, dated Jan. 28, 2019 issued in Application No. CN 201610181756.X.

Chinese Second Office Action dated May 7, 2020 issued in Application No. CN 201711372325.2.

Chinese Second Office Action, dated May 8, 2017, issued in Application No. CN 201410686823.4.

Chinese Third Office Action, dated Aug. 2, 2019 issued in Application No. CN 201610181756.X.

Chinese Third Office Action dated Dec. 1, 2020 issued in Application No. CN 201711372325.2.

Cunge et al. (2005) "New chamber walls conditioning and cleaning strategies to improve the stability of plasma processes," Plasma Sources Sci. Technol. 14:509-609.

Cunge et al. (2005) "Plasma-wall interactions during silicon etching processes in high-density HBr/Cl2/O2 plasmas," Plasma Sources Sci. Technol. 14:S42-S52.

Fotovvati, Behzad, et al., "On Coating Techniques for Surface Protection: A Review" Journal of Manufacturing and Materials Processing, 2019, 3, 28, pp. 1-22.

Hu, L, et al., "Coating Strategies for Atomic Layer Deposition". Nanotechnology. Jan. 2017, vol. 6, No. 6, pp. 527-547.

International Preliminary Report and Patentability dated Apr. 29, 2021 issued in PCT/US2019/055264.

International Preliminary Report and Patentability dated Jun. 25, 2020 issued in PCT/US2018/064090.

International Preliminary Report on Patentability dated Jun. 18, 2020 in PCT Application No. PCT/US2018/064304.

International Search Report and Written Opinion dated Apr. 1, 2019, in PCT Application No. PCT/US2018/064304.

International Search Report dated Feb. 5, 2020 issued in PCT/US2019/055264.

International Search Report dated Mar. 22, 2019 issued in Application No. PCT/US2018/064090.

Japanese First Office Action, dated Aug. 18, 2021, issued in Application No. JP 2020-185592.

Japanese First Office Action, dated Jan. 8, 2019, issued in Application No. JP 2014-233410.

Japanese First Office Action, dated Mar. 10, 2020 issued in Application No. JP 2016-054587.

(56) References Cited

OTHER PUBLICATIONS

Japanese Second Office Action, dated Dec. 15, 2020 issued in Application No. JP 2016-054587.
Japanese Second Office Action, dated Nov. 19, 2019, issued in Application No. JP 2014-233410.
Japanese Third Office Action, dated Jul. 3, 2020, issued in Application No. JP 2014-233410.
Japanese Third Office Action, dated Sep. 10, 2021 issued in Application No. JP 2016-054587.
JP Office Action dated Feb. 8, 2022, in Application No. JP2020-185592 with English translation.
Juárez, H., et al., (2009) "Low temperature deposition: properties of Si02 films from TEOS and ozone by APCVD system," XIX Latin American Symposium on Solid State Physics (SLAFES XIX). Journal of Physics: Conference Series 167(012020) pp. 1-6.
Kang et al. (Jul./Aug. 2005) "Evaluation of silicon oxide cleaning using F2/Ar remote plasma processing," J. Vac. Sci. Technol. A 23(4):911-916.
Kim et al. (1991) "Recombination of O, N, and H Atoms on Silica: Kinetics and Mechanism," Langmuir, 7(12):2999-3005.
Kim et al. (2015) "Investigation of Plasma Enhanced Chemical Vapor Deposition Chamber Mismatching by Photoluminescence and Raman Spectroscopy," ECS Journal of Solid State Science and Technology, 4(8)P314-P318.
Klimecky et al. (May/Jun. 2003) "Compensation for transient chamber wall condition using real-time plasma density feedback control in an inductively coupled plasma etcher," Journal Vac. Sci. Technol. A, 21 (3):706-717.
Knoops et al.(2010) "Conformality of Plasma-Assisted ALD: Physical Processes and Modeling," Journal of The Electrochemical Society, 157(12):G241-G249.
Korean First Office Action dated Apr. 16, 2021 issued in Application No. KR 10-2015-0007827.
Korean First Office Action, dated Jul. 1, 2021, issued in Application No. KR 10-2014-0165420.
KR Office Action dated Apr. 20, 2022, in Application No. KR10-2022-0020744 with English translation.
KR Office Action dated Dec. 21, 2021, in Application No. KR1020140165420 with English translation.
KR Office Action dated Feb. 8, 2022, in Application No. 10-2017-0172906 with English translation.
KR Office Action dated Jun. 1, 2022, in Application No. KR10-2014-0165420 with English Translation.
KR Office Action dated Jun. 9, 2022, in Application No. KR10-2022-0017172 with English translation.
KR Office Action dated Mar. 10, 2022, in Application No. KR1020220017172 with English translation.
KR Office Action dated May 26, 2022, in Application No. KR10-2016-0042618 With English Translation.
KR Office Action dated Nov. 17, 2021, in Application No. KR1020150007827 with English translation.
Lin, Tzu-Ken, et al., Comparison of Erosion Behavior and Particle Contamination in Mass-Production CF4/02 Plasma Chambers Using Y203 and YF3 Protective Coatings. Nanomaterials, 2017, 7, 183, pp. 1-9.
Lin, Tzu-Ken, et al., "Preparation and Characterization of Sprayed-Yttrium Oxyfluoride Corrosion Protective Coating for Plasma Process Chambers" Coatings, 2018, 8, 373, Oct. 22, 2018, pp. 1-8.
Nakagawa, Takahide (May 1991) "Effect of Coating on the Plasma Chamber Wall in RIKEN Electron Cyclotron Resonance Ion Source," Japanese Journal of Applied Physics, 30(5B)L930-L932.
Notice of Allowance, dated Mar. 22, 2018, issued in U.S. Appl. No. 14/683,022.
Park, Seung Hyun, et al., "Surface Analysis of Chamber Coating Materials Exposed to CF4/02 Plasma". Coatings, 2021, 11, 105, pp. 1-11.
Taiwanese First Office Action dated Apr. 21, 2021 issued in Application No. TW 106144306.
Taiwanese First Office Action dated Apr. 30, 2018 issued in Application No. TW 103140644.
Taiwanese First Office Action dated Oct. 16, 2019 issued in Application No. TW 105109337.
Taiwanese Notice of Allowance dated Apr. 17, 2020 issued in Application No. TW 105109337.
Taiwanese Notice of Allowance dated Aug. 10, 2018 issued in Application No. TW 104101422.
TW Office Action dated May 9, 2022, in Application No. TW107144472 with English translation.
U.S Corrected Notice of Allowance dated Mar. 3, 2022, in U.S. Appl. No. 16/935,760.
U.S. Final Office Action, dated Apr. 20, 2017, issued in U.S. Appl. No. 14/712,167.
U.S. Final Office Action dated Aug. 16, 2018 issued in U.S. Appl. No. 15/650,731.
U.S. Final Office Action, dated Dec. 17, 2021, issued in U.S. Appl. No. 15/794,786.
U.S. Final Office Action, dated Jan. 15, 2020, issued in U.S. Appl. No. 15/954,454.
U.S. Final Office Action, dated Jul. 6, 2020, issued in U.S. Appl. No. 15/794,786.
U.S. Final Office Action, dated Jun. 18, 2018, issued in U.S. Appl. No. 15/384,175.
U.S. Final Office Action, dated Nov. 3, 2017, issued in U.S. Appl. No. 14/683,022.
U.S. Final Office Action dated Oct. 28, 2016 issued in U.S. Appl. No. 14/089,653.
U.S. Notice of Allowance, dated Apr. 22, 2020, issued in U.S. Appl. No. 15/954,454.
U.S. Notice of Allowance, dated Aug. 18, 2017, issued in U.S. Appl. No. 14/712,167.
U.S. Notice of Allowance dated Feb. 16, 2022 in U.S. Appl. No. 16/935,760.
U.S. Notice of Allowance, dated Jan. 11, 2016, issued in U.S. Appl. No. 14/158,536.
U.S. Notice of Allowance dated Jan. 23, 2017 issued in U.S. Appl. No. 14/089,653.
U.S. Notice of Allowance dated Jun. 1, 2017 issued in U.S. Appl. No. 14/089,653.
U.S. Notice of Allowance, dated May 8, 2019, issued in U.S. Appl. No. 15/782,410.
U.S. Notice of Allowance, dated Oct. 3, 2018, issued in U.S. Appl. No. 15/384,175.
U.S. Office Action, dated Aug. 17, 2015, issued in U.S. Appl. No. 14/158,536.
U.S. Office Action dated Dec. 10, 2015 issued in U.S. Appl. No. 14/089,653.
U.S. Office Action, dated Feb. 28, 2020, issued in U.S. Appl. No. 15/794,786.
U.S. Office Action, dated Jan. 24, 2019, issued in U.S. Appl. No. 15/782,410.
U.S. Office Action, dated Jan. 29, 2021, issued in U.S. Appl. No. 15/794,786.
U.S. Office Action dated Mar. 14, 2018 issued in U.S. Appl. No. 15/650,731.
U.S. Office Action, dated Mar. 24, 2017, issued in U.S. Appl. No. 14/683,022.
U.S. Office Action dated May 13, 2016 issued in U.S. Appl. No. 14/089,653.
U.S. Office Action, dated Nov. 18, 2016, issued in U.S. Appl. No. 14/712,167.
U.S. Office Action, dated Nov. 20, 2017, issued in U.S. Appl. No. 15/384,175.
U.S. Office Action, dated Oct. 8, 2019, issued in U.S. Appl. No. 15/954,454.
U.S. Office Action, dated Sep. 28, 2021, issued in U.S. Appl. No. 16/935,760.
U.S. Office Action, dated Sep. 3, 2021, issued in U.S. Appl. No. 15/794,786.
U.S. Appl. No. 17/663,614, inventors Shanbhag et al., filed May 16, 2022.
U.S. Restriction Requirement dated Mar. 29, 2022, in U.S. Appl. No. 17/649,020.

(56) References Cited

OTHER PUBLICATIONS

Japanese Office Action dated Feb. 14, 2023 issued in Application No. JP2022-004040 with English translation.
KR Office Action dated Feb. 14, 2023 in Application No. KR10-2023-0013752 with English translation.
KR Office Action dated Feb. 27, 2023, in Application No. KR10-2022-7018308.
KR Office Action dated Nov. 26, 2022, in Application No. KR1020220020744 with English translation.
U.S Advisory Action dated Mar. 20, 2023 in U.S. Appl. No. 17/649,020.
JP Office Action dated Nov. 15, 2022, in Application No. JP2020-532621 with English translation.
KR Office Action dated Oct. 14, 2022, in Application No. KR10-2022-7018308, with English Translation.
KR Office Action dated Aug. 1, 2022, in Application No. 10-2017-0172906.
KR Office Action dated Nov. 1, 2022, in Application No. 10-2017-0172906 with English translation.
KR Office Action dated Nov. 17, 2022, in Application No. KR10-2016-0042618 with English translation.
KR Office Action dated Nov. 26, 2022, in Application No. KR1020220020744.
KR Office Action dated Oct. 24, 2022, in Application No. KR10-2014-0165420 with English Translation.
U.S. Final Office Action dated Dec. 6, 2022 in U.S. Appl. No. 17/649,020.
U.S. Non-Final Office Action dated Aug. 5, 2022, in U.S. Appl. No. 17/649,020.
TW Office Action dated Jun. 28, 2023 in Application No. TW111120546 with English translation.
U.S. Non-Final Office Action dated Jun. 26, 2023, in U.S. Appl. No. 17/649,020.

* cited by examiner

200

| FILM | STRESS (MPA) | AVG THK (A) | AVG RI |
|---|---|---|---|
| FIRST HYBRID | 99 | 1152.6 | 1.4393 |
| BASE | 23.9 | 1313.0 | 1.4514 |

Fig.2

0.8 μm BATCH SIZE

Fig. 3A

2 μm BATCH SIZE

OXIDATION RESISTANT PROTECTIVE LAYER IN CHAMBER CONDITIONING

CLAIM OF PRIORITY

This patent application is a U.S. National Stage Filing under 35 U.S.C. 371 from International Application No. PCT/US2018/064304, filed on Dec. 6, 2018, and published as WO 2019/113351 A1 on Jun. 13, 2019, which claims the benefit of priority to U.S. Provisional Patent Application Ser. No. 62/595,948, filed on Dec. 7, 2017, each of which is hereby incorporated by reference herein in its entirety.

FIELD

The present disclosure relates generally to process and conditioning cycles in wafer processing chambers and in particular to defect reduction and batch size extension by utilizing oxidation resistant protective layers in wafer processing and chamber conditioning operations.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Over time, repeated wafer processing cycles in a processing chamber can cause films of various types to accumulate on the chamber walls. As film levels increasingly build on components within the reaction chamber, film stresses can increase and adhesion between the accumulated film and the surface of the chamber can deteriorate significantly over time. This loss of adhesion can lead to portions of the accumulated film flaking off the chamber walls. When there is excessive film accumulation inside the chamber, the accumulated film does not adhere well to the chamber walls and it starts to peel off. Flakes and portions of peeled film can fall on to a wafer in the processing chamber and manifest itself as particles or defects. In some instances, oxygen-rich plasma exacerbates film flaking as, firstly, it can cause the accumulated film to shrink, resulting in higher tension, and secondly, it can consume carbon species in the accumulated film and thus cause further deterioration in film adhesion.

SUMMARY

In some examples, a method for conditioning a wafer processing chamber comprises setting a pressure in the chamber to a predetermined pressure range; setting a temperature of the chamber to a predetermined temperature; supplying a process gas mixture to a gas distribution device within the chamber, wherein the process gas mixture includes a gas including at least an oxygen species, and a helium or argon gas; striking a plasma within the chamber; monitoring a condition in the chamber; based on a detection of the monitored condition meeting or transgressing a threshold value, implementing a chamber conditioning operation, wherein the chamber conditioning operation comprises: depositing a preconditioning film onto an internal surface of the chamber, depositing a silicon oxycarbide (SiCO) film onto the preconditioning film, and depositing a protective layer onto the SiCO film.

DESCRIPTION OF THE DRAWINGS

Some embodiments are illustrated by way of example and not limitation in the figures of the accompanying drawings.

DESCRIPTION

The description that follows includes systems, methods, techniques, instruction sequences, and computing machine program products that embody illustrative embodiments of the present invention. In the following description, for purposes of explanation, numerous specific details are set forth in order to provide a thorough understanding of example embodiments. It will be evident, however, to one skilled in the art that the present inventive subject matter may be practiced without these specific details.

Portions of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2018, All Rights Reserved.

By way of background, a wafer processing chamber (such as a Striker Carbide™ processing chamber) can permit remote plasma chemical vapor deposition (RPCVD) technology to produce highly conformal silicon carbide films. Some highly conformal silicon carbide films are known as SPARC™ films. At various times during cycles of wafer processing in a chamber, a chamber cleaning or conditioning operation may be required. A chamber clean may be required when on-wafer defect performance is out of specification. As referenced above, if film accumulation within a chamber is too high, the accumulated film may begin to flake off and deposit particles on a processed wafer. This can lead to high levels of defects in the chips and devices made from wafers processed in the chamber. A chamber cleaning operation can remove some or all of the accumulated film to render defect performance back into specification again.

After a chamber clean, a thin layer of oxide film (also known as a preconditioning film) is typically deposited on one or more inner surfaces of a processing chamber using atomic layer deposition (ALD) followed by the deposition of another thin layer of silicon oxycarbide (SiCO) film using RPCVD. In some instances, accumulated film thicknesses within a chamber are comprised solely of SiCO. As SiCO films are prone to becoming oxidized, further film deposition on a wafer being processed within the chamber by an oxygen-rich plasma exacerbates the oxidation issue. The application of a SiCO film after cleaning therefore does not necessarily cure the problem of defect performance degradation. In other words, the "defect performance" of a processing chamber, or its ability to prevent defects from occurring in wafers processed within it, can become increasingly compromised over time.

In other conventional approaches, prior to deposition of a SPARC™ film on a wafer, a wafer preconditioning operation may be performed to modify surface conditions of the substrate (wafer) when applying the SPARC™ film to a wafer. A wafer preconditioning step may include for example the application to the wafer surface of an initiation layer and a surface treatment thereof. But even during this wafer preconditioning operation, film layers on the chamber surfaces can still be attacked by the oxygen-rich plasma. The plasma can reduce the thickness of the preconditioning film on the chamber surface as well as other accumulated film layers on the chamber surfaces. A reduction in thickness, or shrinkage, can cause the "stress" of an accumulated film on a chamber surface (including for example the chamber walls and showerhead) to become more tensile in nature, while adhesion of the preconditioning film to subsequent layers can itself be compromised for similar reasons. These shrinkage and stress effects can lead to early failure of wafer performance, impaired chamber defect performance, higher on-wafer defect occurrence, and reduced batch sizes through the rejection of defective chips or other devices sourced from compromised wafers.

In some examples of the present disclosure, the problems discussed above are addressed by implementing periodic chamber conditioning creating a high-carbon-content and oxidation-resistant protective layer on the chamber surfaces to compensate for film stress and mitigate the effects of an oxygen-rich plasma attack on a preconditioning film. Example triggers for chamber conditioning may include but are not limited to a detected deterioration in defect performance level approaching or meeting a threshold value, or a detected accumulated film stress level approaching or meeting a threshold value. In some examples, a threshold value may be associated with a thickness of an accumulated film within the chamber is within a range from 0.05 to 0.5 µm (microns).

In some examples, a protective layer is formed on surfaces of a chamber by chemical vapor deposition (CVD). Example chemicals used in the deposition reaction include silicon-containing species such as silane and disilane, oxygen-containing species such as oxygen and carbon dioxide, and a diluting gas such as argon or helium. The reaction may occur at a pressure ranging from 0.1 to 10 Torr, and at a temperature ranging from 100° C. to 600° C. When a threshold chamber film accumulation (for example, a thickness in a range 0.05 to 0.5 µm) is reached, the chamber stops processing further wafers. In some examples, the stop in processing may occur automatically upon detection of the threshold accumulation thickness. In some examples, a processing chamber is further configured thereafter to commence deposition of a protective layer without a wafer supported inside the processing chamber. A thickness of a protective layer may vary based on a type of wafer process. Example thicknesses may fall within a range of 50 nanometers (nm) and 1 micron (µm). In some examples, after an initial protective layer is deposited on surfaces of the processing chamber, the processing chamber may continue to process wafers until the chamber film accumulation increases to a further threshold thickness, for example a doubling in thickness. Other thresholds are possible. As the further threshold is met or approached, a protective layer may again be deposited onto the initial layer to maintain the defect performance of the chamber within a given specification. In some examples, a cycle of depositing protective layers continues until a composite protective film is formed. In some examples, the creation of a composite protective film continues until an outer layer thereof is unable to adhere to the composite film, or until a breakdown of the outer layer is unable to prevent the initial film previously applied to the inner surface of the chamber from peeling off and causing on-wafer defects and other problems in the manner discussed above.

Figure 4:
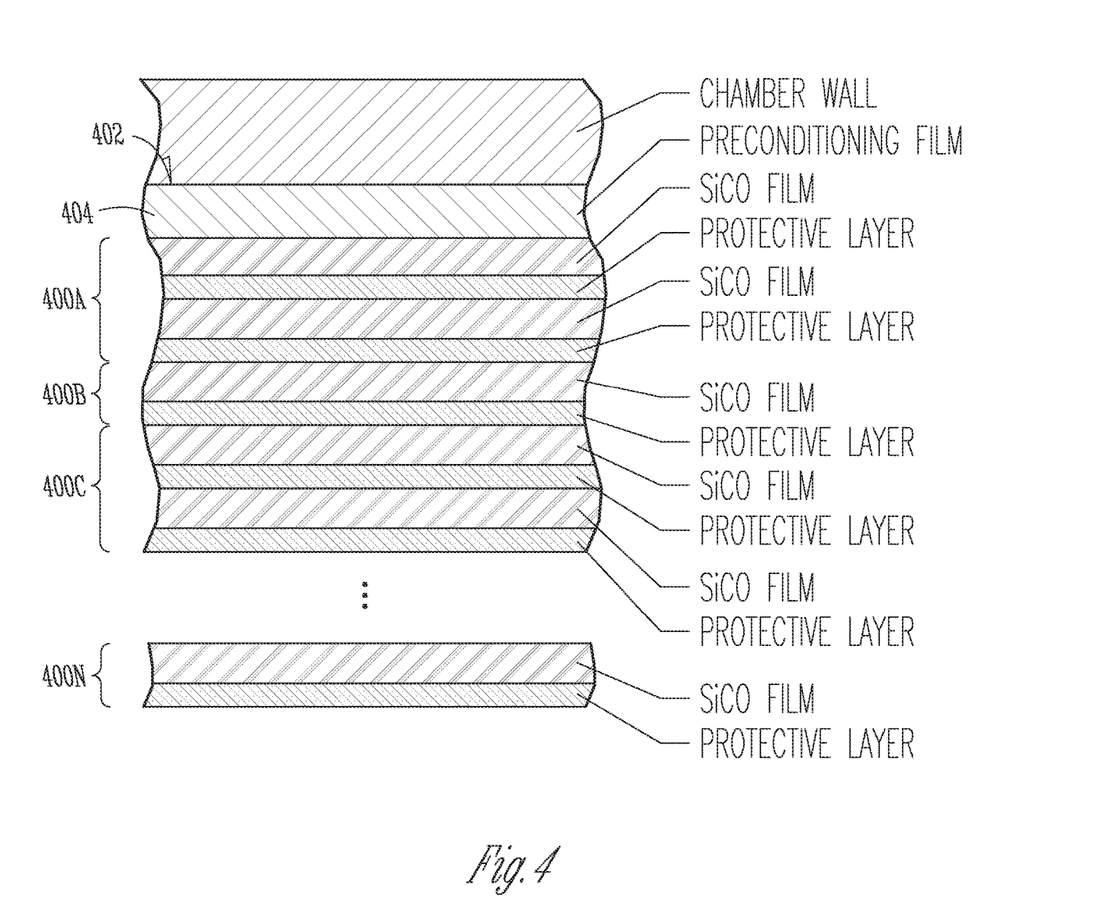
FIG. 4 is a sectional view of a composite protective layer, according to an example embodiment.

A sectional view of an example protective layer with layers of film elements generally labeled 400 is shown in FIG. 4. The protective layer 400A-N in this example is formed over a preconditioning film 404 formed on a surface 402 of a chamber wall. The illustrated protective layer 400A-N forms a composite protective layer in this example and will hereinafter be referred to as a composite protective film, for clarity. Other examples of composite protective film and layers within them are possible. The composite protective film 400A-N may be formed over time for example by performing one or more of the operations described further above. The composite protective film 400A-N may include repeating or alternating pairs of SiCO and protective layers, as illustrated for example by the successive layers 400A through 400N. The formation of paired SiCO and protective layers may be cycled repetitively to extend the composite protective film 400 until a threshold for a monitored chamber condition is reached. An example threshold may be a thickness of the composite protective film, for example as shown by an outer surface of paired layers 400N.

In some examples, in order to improve the defect performance (i.e. minimize wafer defects) of a processing chamber, such as a Striker Carbide™ chamber, a protective layer is created on one or more chamber surfaces to minimize film damage arising from preconditioning operations. Once a certain film accumulation in the reaction chamber is detected based, for example, on one or more of the threshold values discussed above, a protective layer comprising a high carbon content SiCO film is deposited on one or more chamber surfaces. In some examples, the inherent stress of a protective layer is compressive in nature, therefore it may compensate fully or in part any tensile stress induced in a previously-applied preconditioning film by an oxygen-rich plasma, or by a shrinkage in a preconditioning film thickness. Such film stress reduction or shrinkage compensation may be helpful in suppressing film cracking and flaking induced by high tensile stress.

In some examples, a protective layer may further serve as a sacrificial layer to protect against the effects of an oxygen-rich plasma attack due to a presence of excess carbon atoms in the protective layer. The excess carbon atoms are consumed sacrificially by the oxygen-rich plasma. As a result, the carbon content of the remaining preconditioning film inside the reaction chamber may be similar, for example, to a SPARC™ film having known excellent adhesion qualities and defect performance. By virtue of the methods and systems of the present disclosure, the defect performance of a processing chamber, such as a Striker Carbide™ processing chamber can be significantly improved and maintained. Further, an improved chamber process as described herein can yield batch sizes 250% larger than conventional examples. Some examples facilitate film deposition at high deposition rates, for example deposition rates in a range from 50 to 500 Angstrom (Å)/min for a high-carbon protective layer. Some example high-carbon protective layers include carbon in an amount between 30% and 45% by weight. Some example protective layers are of a relatively low required thickness and the impact on production throughput by creating such a protective layer is therefore minimal. Tests conducted using the methods described herein indicate that batch sizes can be improved in some examples by 250% while maintaining a satisfactory defect performance of the processing chamber that made them.

Figure 1:
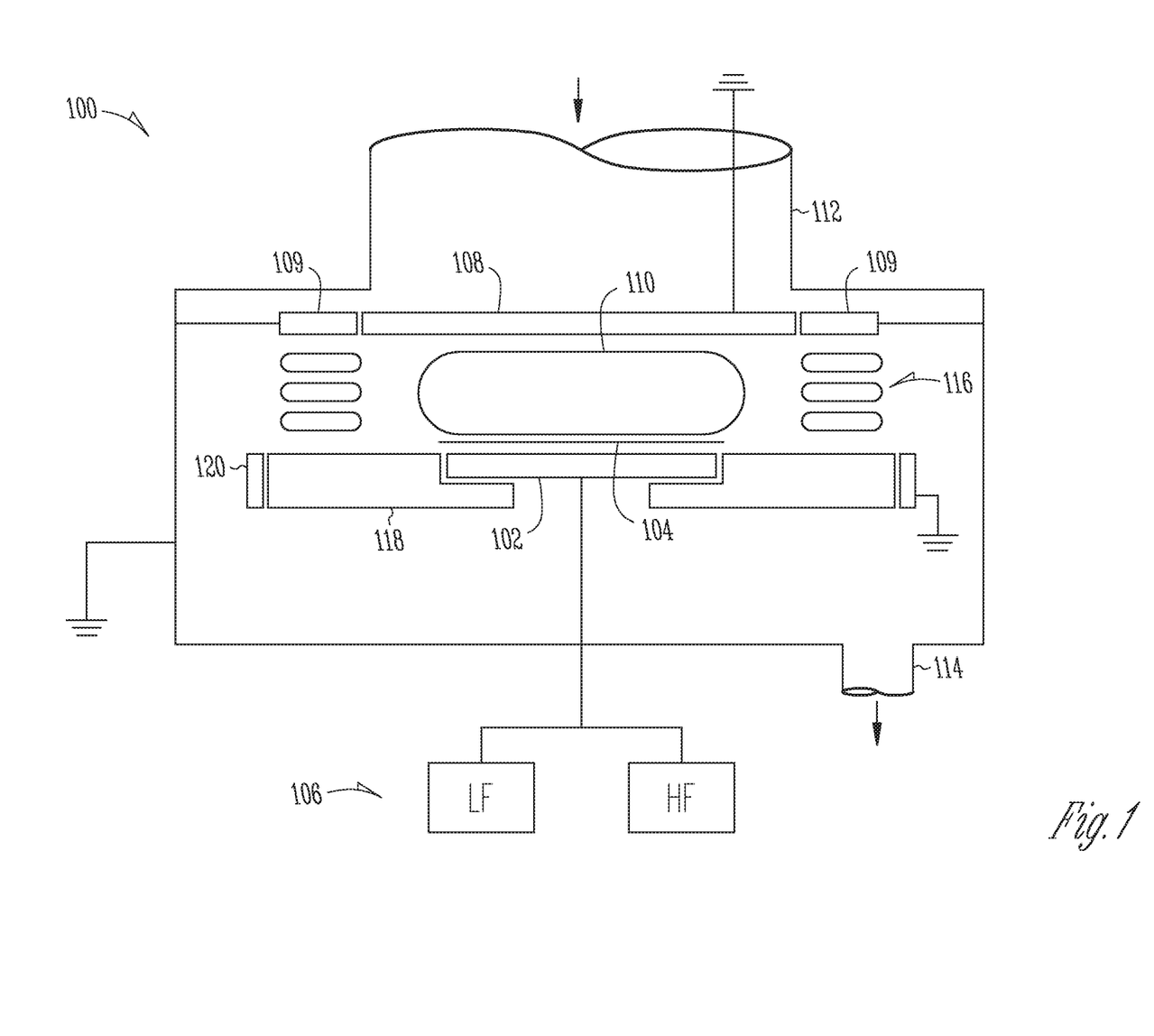
FIG. 1 is a schematic diagram of a wafer processing chamber, within which some example methods of the present disclosure may be employed.

An example chamber in which some example operations of the present disclosure may be employed, with appropriate chamber modifications for film deposition and control testing, is shown in FIG. 1 of the accompanying drawings. A plasma etching (or deposition) apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into Integrated Circuits (IC's). The plasma gas, such as an oxygen-rich plasma gas, may react with other materials in the chamber such as preconditioning or protective films in the manner described above.

Prior to etching, the wafer is placed in the chamber and held in proper position by a chuck or holder which exposes a top surface of the wafer to the plasma gas. There are several types of chucks known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present methods are applicable to both types of chucks.

FIG. 1 illustrates an example capacitively-coupled plasma processing chamber 100, representing an exemplary plasma processing chamber of the types typically employed to etch or make a film deposition on a substrate. A chuck 102 represents an example workpiece holder on which a substrate, such as a wafer 104, may positioned during etching or deposition. The chuck 102 may be implemented by any suitable chucking technique, e.g., electrostatic, mechanical, clamping, vacuum, or the like. During etching, the chuck 102 is typically supplied with dual RF frequencies (a low frequency and high frequency), for example 2 MHz and 27 MHz, simultaneously during etching by a dual frequency source 106.

An upper electrode 108 is located above the wafer 104. The upper electrode 108 is grounded. FIG. 1 illustrates an etching reactor where the surface of the upper electrode 108 is larger than the surface of the chuck 102 and the wafer 104. During etching, plasma 110 is formed from etchant source gas supplied via a gas line 112 and pumped out through an exhaust line 114. An electrical insulator ring 109 insulates the upper electrode 108 from the grounded chamber 100. Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from dual frequency power source 106, equipotential field lines are set up over the wafer 104. The equipotential field lines are the electric field lines across the plasma sheath that is between wafer 104 and the plasma 110. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 118 is typically provided to improve process uniformity across the entire wafer surface. With reference to FIG. 1, wafer 104 is shown disposed within a focus ring 118, which may be formed of a suitable dielectric material such as ceramic, quartz, plastic, or the like. Thus, the presence of the focus ring 118 allows the equipotential field lines to be disposed substantially uniformly over the entire surface of the wafer 104.

An electrically conductive shield 120 substantially encircles the focus ring 118. The electrically conductive shield 120 is configured to be substantially grounded within the plasma processing chamber. The shield 120 prevents the presence of unwanted equipotential field lines outside of focus ring 118.

Figure 2:
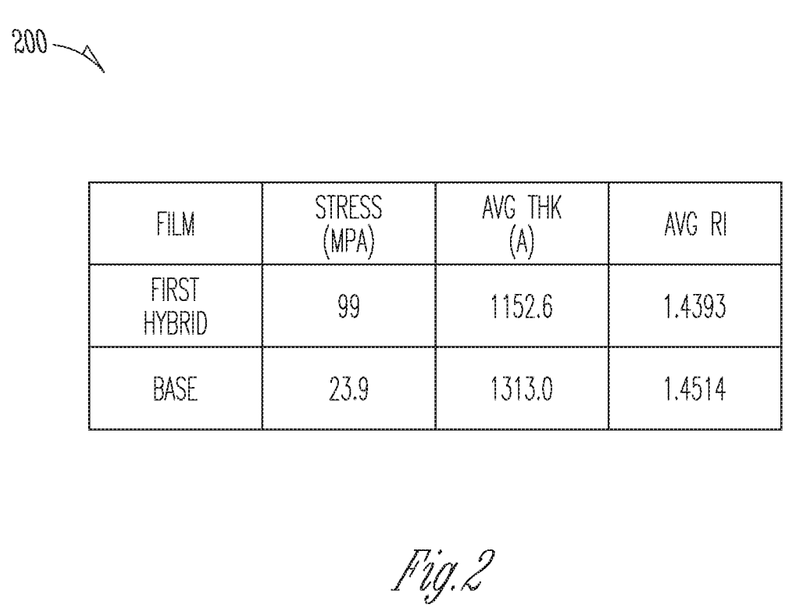
FIG. 2 illustrates a table of results of film shrinkage and stress, according to some example embodiments.

Reference is now made to FIG. 2 of the accompanying drawings with illustrates a table 200 of example film stress and thickness shrinkage results. Here, in some examples, a base film was formed on a test wafer without chamber preconditioning steps as a control example. A first comparative hybrid film was created on another test wafer using the same overall deposition time as the base film, but in this case conventional chamber preconditioning steps of the type described further above were performed successively a total of ten times for every tenth of film thickness in the course of creating the first hybrid film. It will be seen from the table 200 in FIG. 2 that the preconditioning operations resulted in a film stress increase of almost 400% from an initial value of 23.9 MPa for the control base film to a value of 99 MPa for the stressed first hybrid film. Further, the film suffered shrinkage (a reduction in thickness) from 1313.0 (A) for the control base film, to 1152.6 (A) for the first hybrid film.

Figure 3A:
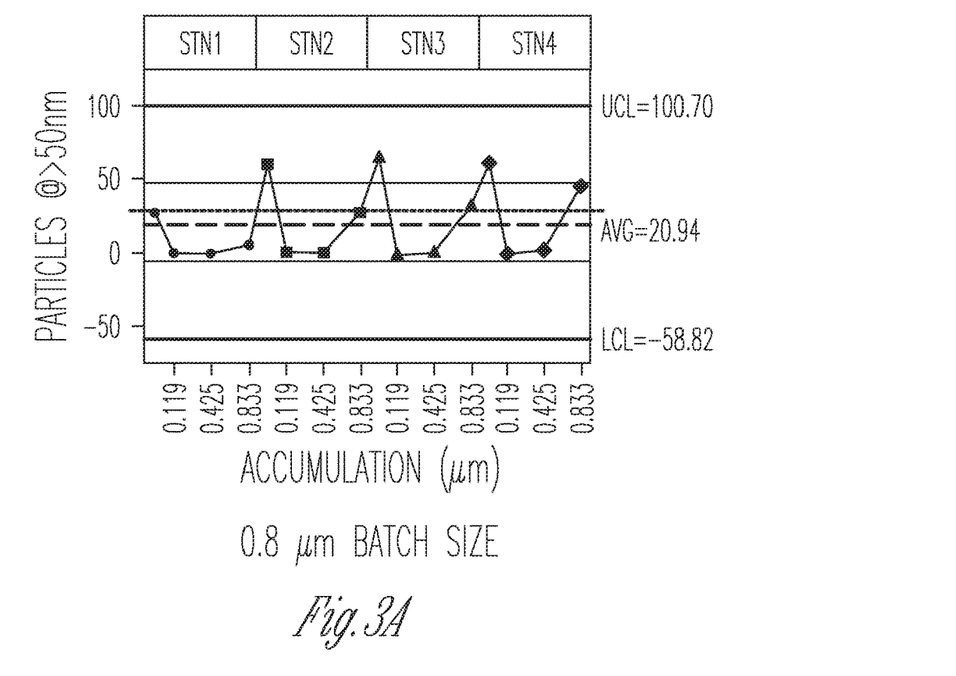
FIGS. 3A-3B illustrate comparison graphs of measured defect performance, according to some example embodiments.
Figure 3B:
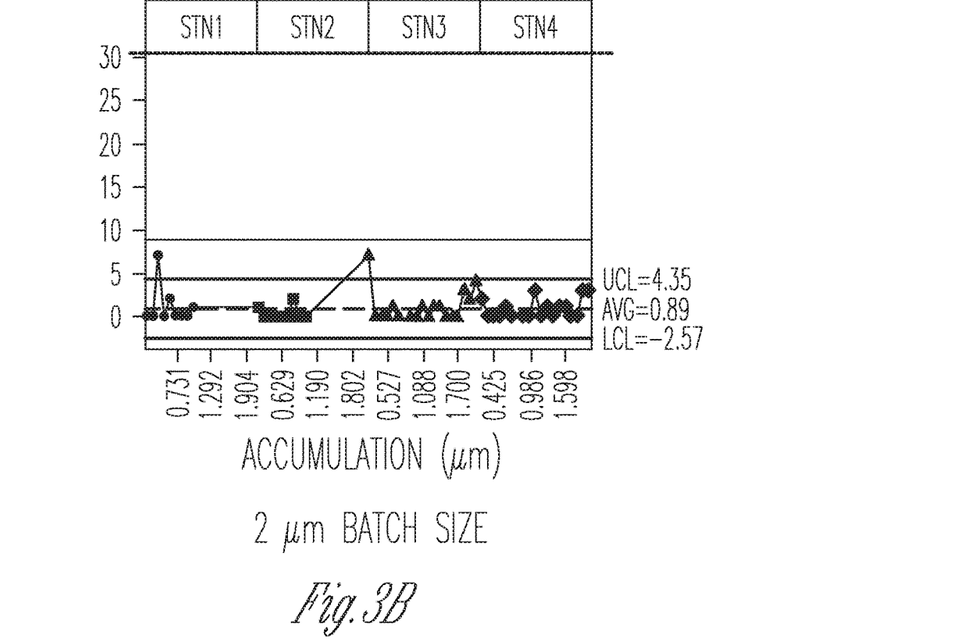

The comparative results depicted in the graphs of FIGS. 3A-3B relate to a second hybrid film. The second hybrid film was formed on a test wafer processed in a chamber conditioned by using a protective layer as exemplified herein. A quadrant module including four stations labeled Stn1 through Stn4 in the views was employed to measure particle size (defects) existing at various deposition layers within the respective films placed under test. Results for the stressed first hybrid film (of the type tested in FIG. 2 above) are shown in FIG. 3A. Results for the second hybrid film formed in a conditioned (protected) chamber of the present disclosure are shown in FIG. 3B. In both views of FIGS. 3A-3B, a particle (defect) size is given on the left vertical axis of the illustrated graph, and a film thickness (or accumulation) is shown along the bottom horizontal axis for each of the four measuring stations.

As shown, particle sizes greater than 50 nm (i.e. defects) spiked at film thicknesses of approximately 0.8 µm at each of the four stations for the stressed first hybrid film as shown in FIG. 3A. On the contrary, notably few, if any, defects were identified in the conditioned second hybrid film results shown in FIG. 3B, even at film thicknesses depths of approximately 2 µm e.g. 1.904 µm for Stn1. Respective values for an Upper Control Limit (UCL) (for example set at three sigma), Lower Control Limit (LCL) and Average values are shown with demonstrable improvement in the conditioned second hybrid film of FIG. 3B.

In view of the foregoing, a workable batch size (i.e. a level of film deposited on a wafer between chamber cleans) based on the illustrated example film results might be established at 0.8 µm as significant defects can be seen to occur at greater film thicknesses. On the contrary, for film conditioned according to methods of the present disclosure, a workable batch size may be established even at film thicknesses of approximately 2 μm or greater as no significant defects appear to arise below this example value.

Figure 5:
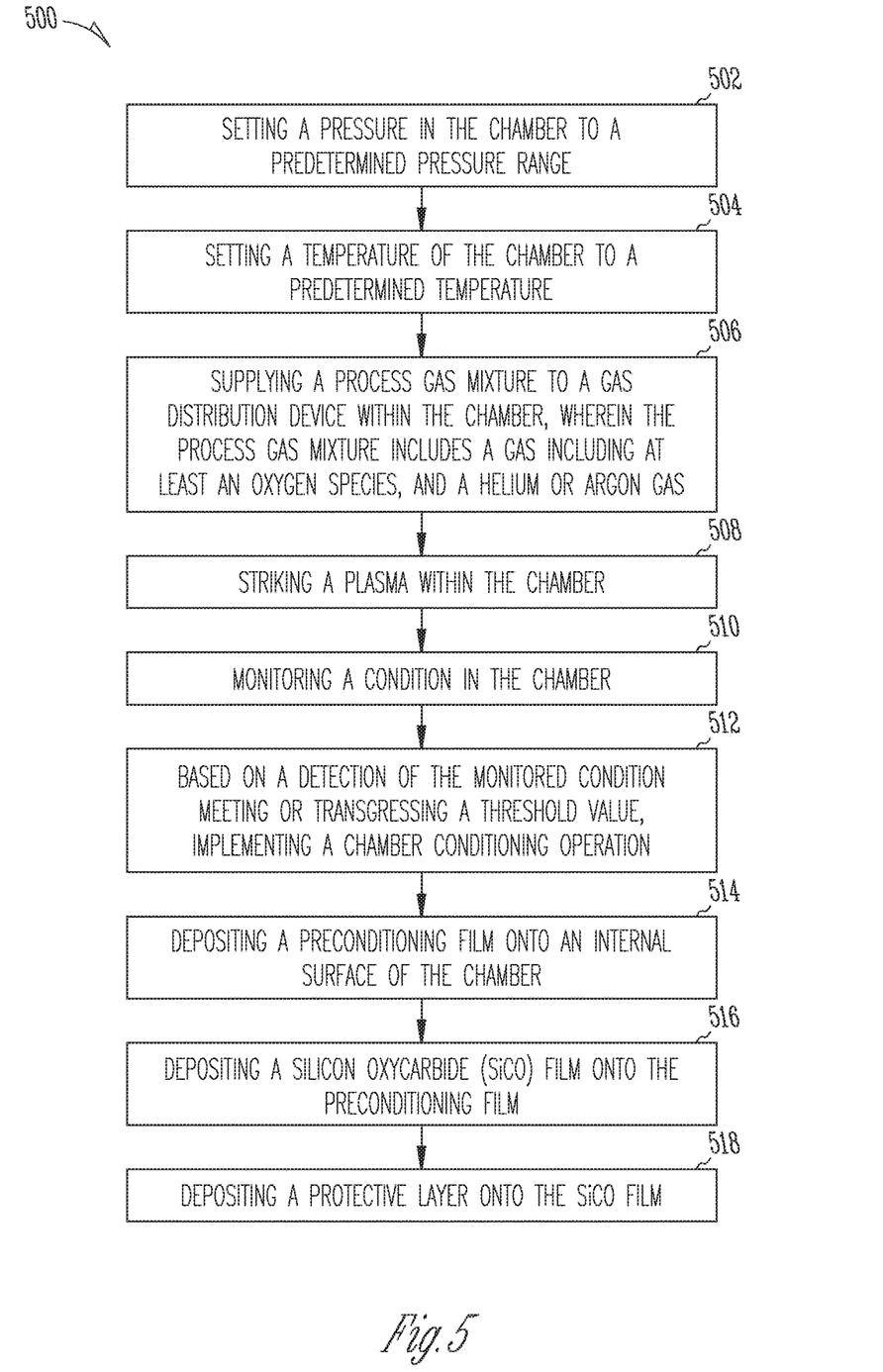
FIG. 5 is a flow chart depicting operations in a method, according to an example embodiment.

Some embodiments of the present disclosure include methods. With reference to FIG. 5, a method 500 for conditioning a wafer processing chamber comprises, at operation 502, setting a pressure in the chamber to a predetermined pressure range; at operation 504, setting a temperature of the chamber to a predetermined temperature; at operation 506, supplying a process gas mixture to a gas distribution device within the chamber, wherein the process gas mixture includes a gas including at least an oxygen species, and a helium or argon gas; at operation 508, striking a plasma within the chamber; at 510, monitoring a condition in the chamber; at operation 512, based on a detection of the monitored condition meeting or transgressing a threshold value, implementing a chamber conditioning operation, wherein the chamber conditioning operation comprises: at operation 514, depositing a preconditioning film onto an internal surface of the chamber, at operation 516, depositing a silicon oxycarbide (SiCO) film onto the preconditioning film and, at operation 518, depositing a protective layer onto the SiCO film.

Some aspects of the method 500 maybe include the following features or operations. In some examples, the monitored condition includes a chamber defect performance. In some examples, the monitored condition includes a film stress value. In some examples, the monitored condition includes a thickness of a film accumulation on the internal surface of the chamber. In some examples, a thickness of the film accumulation is in a range from 0.05 to 0.5 μm (microns).

In some examples, the protective layer is formed by chemical vapor deposition (CVD). A chemical used in a CVD reaction may include a silicon-containing species, such as silane or disilane.

In some examples, the predetermined pressure range of the chamber during deposition of the protective layer is in a range from 0.1 to 10 Torr. In some examples, the predetermined temperature range of the chamber during deposition of the protective layer is in a range from 100° C. to 600° C. In some examples, a thickness of the protective layer is in a range from 50 nanometers (nm) and 1 micron (μm).

In some examples, the operations of depositing a silicon oxycarbide (SiCO) film onto the preconditioning film and depositing a protective layer onto the SiCO film are repeated successively to form paired layers of a SiCO film and a protective layer within a composite protective film.

In some examples, the protective layer is a high-carbon, oxidation-resistant protective layer including 30% to 45% by weight carbon.

In some examples, the method 500 further comprising depositing the protective layer at a deposition rate in a range from 50 to 500 Angstrom (A)/min.

In some examples, striking the plasma comprises supplying HF power to one of an upper electrode and a lower electrode in a range from 500 to 6000 W and LF power to the one of the upper electrode and the lower electrode in a range from 500 to 6000 W. In some examples, striking the plasma comprises supplying HF power to one of an upper electrode and a lower electrode in a range from 2000 to 4000 W and LF power to the one of the upper electrode and the lower electrode in a range from 1000 to 4000 W.

Although an embodiment has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method for conditioning a substrate processing chamber, the method comprising:
    setting a pressure in the substrate processing chamber to within a predetermined pressure range;
    setting a temperature of the substrate processing chamber to within a predetermined temperature range;
    supplying a process gas mixture to a gas distribution device within the substrate processing chamber, wherein the process gas mixture includes a gas including at least an oxygen species, and a helium or argon gas;
    striking a plasma within the substrate processing chamber;
    monitoring a condition in the substrate processing chamber;
    detecting the monitored condition meeting or transgressing a threshold value;
    based on a detection of the monitored condition meeting or transgressing a threshold value, implementing a substrate processing chamber conditioning operation, wherein the substrate processing chamber conditioning operation comprises:
    depositing, in the substrate processing chamber, a preconditioning film by atomic layer deposition (ALD) onto an internal surface of the substrate processing chamber,
    depositing, in the substrate processing chamber, a silicon oxycarbide (SiCO) film by remote plasma chemical vapor deposition (RPCVD) onto the preconditioning film, and
    depositing, in the substrate processing chamber, a protective layer by chemical vapor deposition (CVD) onto the SiCO film, wherein the protective layer has a different composition than the SiCO film.

2. The method of claim 1, further comprising: repeating the depositing of a protective layer onto the SiCO film successively to form paired layers of an SiCO film and a protective layer to form a composite protective film, the composite protective film including the preconditioning film and successive paired layers of an SiCO film and a protective layer, and forming the paired layers until a threshold thickness for the composite protective film is reached.

3. The method of claim 1, wherein the monitored condition includes a film stress value or defect performance of the substrate processing chamber.

4. The method of claim 1, wherein the monitored condition includes a thickness of a film accumulation on the internal surface of the substrate processing chamber.

5. The method of claim 4, wherein the thickness of the film accumulation is in a range from 0.05 to 0.5 μm (microns).

6. The method of claim 1, wherein the protective layer has a different carbon content than the SiCO film.

7. The method of claim 1, wherein a chemical used in a reaction of the CVD for deposition of the protective layer includes a silicon-containing species.

8. The method of claim 7, wherein the silicon-containing species includes silane or disilane.

9. The method of claim 1, wherein the pressure in the substrate processing chamber during deposition of the protective layer is set to within a range from 0.1 to 10 Torr.

10. The method of claim 1, wherein the temperature of the substrate processing chamber during deposition of the protective layer is set to within a range from 100° C. to 600° C.

11. The method of claim 1, wherein a thickness of the protective layer is in a range from 50 nanometers (nm) and 1 micron (μm).

12. The method of claim 1, wherein the protective layer is an oxidation-resistant protective layer including 30% to 45% by weight carbon.

13. The method of claim 1, wherein the protective layer is deposited at a deposition rate in a range from 50 to 500 Angstrom (A)/min.

14. The method of claim 1, wherein striking the plasma comprises supplying power to one of an upper electrode and a lower electrode in a range from 500 W to 6000 W.

* * * * *